United States Patent
Sugiyama (10) Patent No.: US 8,493,091 B2
(45) Date of Patent: Jul. 23, 2013

(54) PROGRAMMABLE LOGIC DEVICE

(75) Inventor: Iwao Sugiyama, Hachioji (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/485,405

(22) Filed: May 31, 2012

(65) Prior Publication Data

US 2013/0027080 A1 Jan. 31, 2013

(30) Foreign Application Priority Data

Jul. 27, 2011 (JP) .................................. 2011-164384

(51) Int. Cl.
*H03K 19/177* (2006.01)

(52) U.S. Cl.
USPC .............................................. 326/41; 326/39

(58) Field of Classification Search
USPC ...................................................... 326/37–41
See application file for complete search history.

(56) References Cited

U.S. PATENT DOCUMENTS

| | | | |
|---|---|---|---|
| 5,787,007 A * | 7/1998 | Bauer ............................ | 716/117 |
| 6,496,971 B1 * | 12/2002 | Lesea et al. .................... | 716/128 |
| 6,526,557 B1 | 2/2003 | Young et al. | |
| 7,973,556 B1 * | 7/2011 | Noguera Serra et al. ....... | 326/38 |
| 2005/0251778 A1 * | 11/2005 | Goodnow et al. ............... | 716/17 |
| 2006/0273823 A1 * | 12/2006 | Kamp et al. .................... | 326/41 |
| 2012/0131288 A1 * | 5/2012 | Box et al. ....................... | 711/154 |
| 2012/0262201 A1 * | 10/2012 | Redgrave ........................ | 326/39 |

* cited by examiner

*Primary Examiner* — Don Le
(74) *Attorney, Agent, or Firm* — Arent Fox LLP (57) ABSTRACT

A programmable logic device includes: a logic block unit including logic blocks which are programmably connectable and perform a logical operation on an input data stream; and a configuration control circuit configured to control a logical operation configuration of the logic blocks in response to configuration information, wherein the configuration control circuit controls the logical operation configuration of the logic blocks based on first configuration information for a logical operation of a first input data stream included in the input data stream, receives second configuration information for a logical operation of a second input data stream included in the input data stream, while the first input data stream is supplied to the logic block unit, and controls a logical operation configuration of the second data stream based on the second configuration information in response to termination of the logical operation of the first input data stream.

13 Claims, 9 Drawing Sheets

PROGRAMMABLE LOGIC DEVICE

CROSS-REFERENCE TO RELATED APPLICATION(S)

This application is based upon and claims the benefit of priority of the prior Japanese Patent Application No. 2011-164384, filed on Jul. 27, 2011, the entire contents of which are incorporated herein by reference.

FIELD

The embodiments discussed herein are related to a programmable logic device.

BACKGROUND

A programmable logic device where a circuit configuration is changed by a program includes a semiconductor integrated circuit, for example, a Field Programmable Gate Array (FPGA). The FPGA may include a variable-logic logic block including a look-up table memory, and a switch matrix programmably wire-connecting the variable-logic logic block. The address line of the look-up table corresponds to a logical input, and the output thereof corresponds to a logical operation result. The data of the look-up table is rewritten, and hence a logic block equivalent to an arbitrary logical operation is generated. The output of the logic block is wired through a connection box so as to be wire-connected to another logic block by a switch box programmably switched. For example, in the FPGA, the logic block, the switch box, and the connection box may be disposed in a checkered pattern-like array form. Configuration (reconfiguration) is performed where the data of the look-up table, the data of the switch box, or the data of the connection box is preliminarily set.

In the FPGA of an application, after power activation, configuration information is transferred to the inside of a device, and a clock is applied (batch reconfiguration). In a partial reconfiguration-type FPGA, the configuration of a portion of a circuit block is changed during operation. A circuit used for isolating the logic block and the switch matrix from another logic block group in terms of a circuit is added, and the configuration information of the logic block is rewritten during the operation of another circuit.

A related technique has been disclosed in U.S. Pat. No. 6,526,557 or the like.

SUMMARY

According to one aspect of the embodiments, a programmable logic device includes: a logic block unit including logic blocks which are programmably connectable and perform a logical operation on an input data stream; and a configuration control circuit configured to control a logical operation configuration of the logic blocks in response to configuration information, wherein the configuration control circuit controls the logical operation configuration of the logic blocks based on first configuration information for a logical operation of a first input data stream included in the input data stream, receives second configuration information for a logical operation of a second input data stream included in the input data stream, while the first input data stream is supplied to the logic block unit, and controls a logical operation configuration of the second data stream based on the second configuration information in response to termination of the logical operation of the first input data stream.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a partial reconfiguration-type FPGA, configuration information, for example, a full-bit file, a partial-bit file, or the like, is preliminarily stored in an external non-volatile memory or an external data storage. At the time of power activation, before the execution of partial reconfiguration, a control device, for example, a microcontroller, transfers data to a configuration memory within the FPGA.

Whole configuration information and a plurality of pieces of partial reconfiguration information are stored in a storage medium such as a flash memory or the like. At the time of power activation, the whole configuration information is loaded and a system operates. A signal line coupled to a region including partial reconfiguration may be fixed using a flip-flop or the like, and the propagation of a signal change may be reduced. Reconfiguration information is loaded into a partial reconfiguration region from the storage medium. The flip-flop is released, and the signal line is re-coupled.

The above-mentioned operating is controlled by a processor controller, a sequencer, a state machine, or the like inside or outside a chip.

Sequential operations are performed where a region used for performing partial reconfiguration is set, the signal line is fixed, subsequent configuration information is loaded, and the signal line is reconnected. Therefore, a time taken for the partial reconfiguration may be from several tens times to several hundreds times the operation speed of the FPGA.

The structure of the partial reconfiguration-type FPGA may also be equivalent to the aggregation of a plurality of FPGA blocks subjected to region division. In application to an application in which process is performed with the configuration information being changed, for example, a system such as reconfigurable computing, the overhead of the system may be large.

Sequence control is performed by a control device such as a microcontroller. A controller may be added to the FPGA or embedded in the FPGA.

When the partial change of a system in operation is performed using the partial reconfiguration-type FPGA, a region whose configuration is to be changed is separated once, and is reconnected after reconfiguration. Therefore, a data flow may be halted.

When the reconfiguration is performed in small logical units, since a reconfiguration sequence is performed on each subdivision region, the overhead of the execution of the reconfiguration sequence may be large.

Figure 1A:
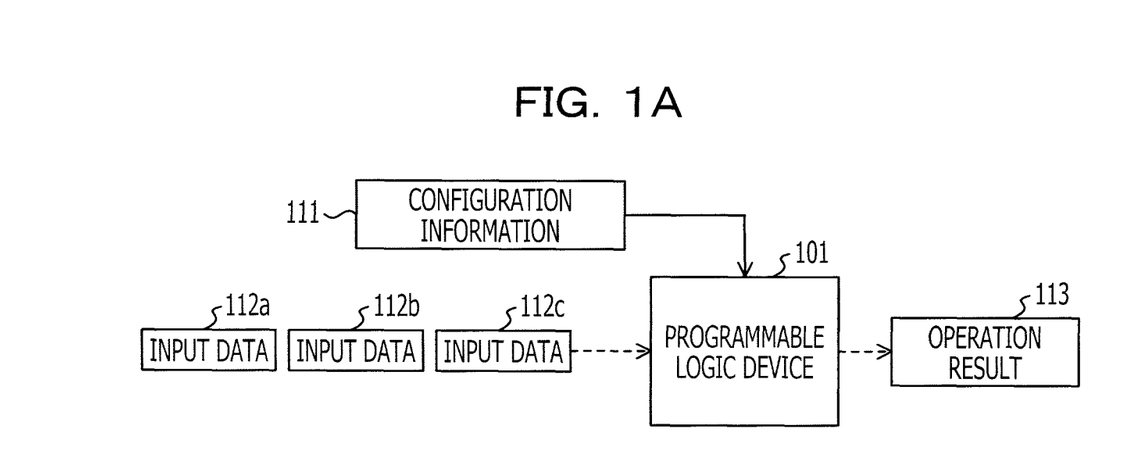
FIG. 1A and FIG. 1B illustrate an exemplary input and an exemplary output of a programmable logic device.
Figure 1B:
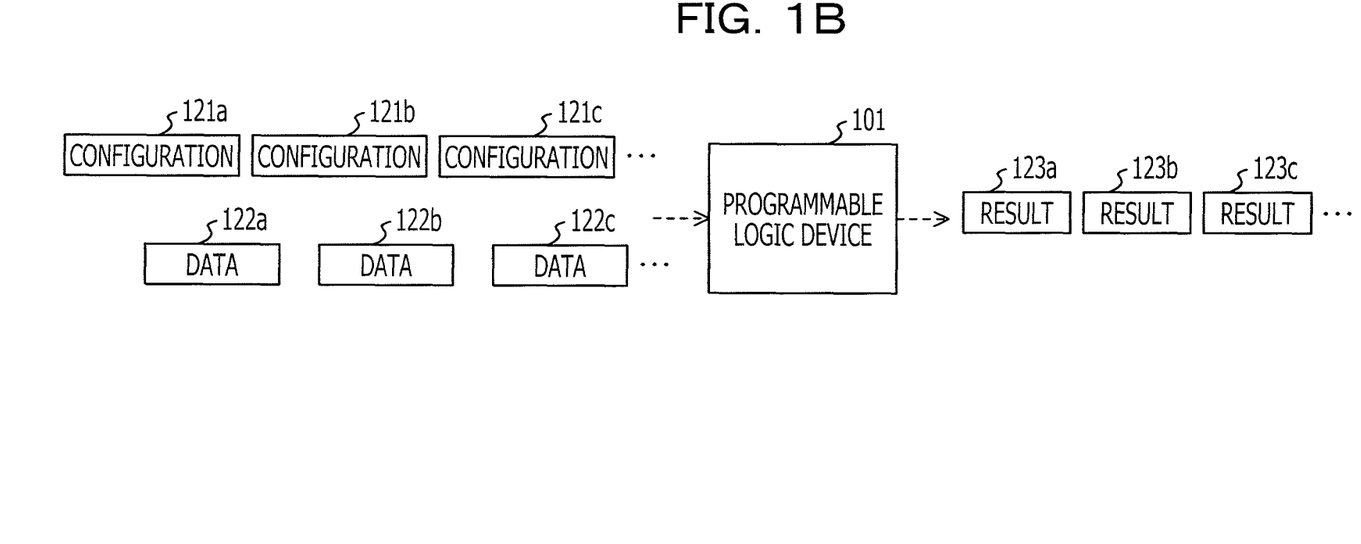

FIG. 1A and FIG. 1B illustrate an exemplary input and an exemplary output of a programmable logic device. A programmable logic device 101, for example, a programmable logical operation unit includes a configuration fixed mode illustrated in FIG. 1A and a configuration variable mode illustrated in FIG. 1B. For example, the programmable logic device 101 may be a Field Programmable Gate Array (FPGA). The programmable logic device 101 may include a plurality of logic blocks performing a logical operation, and the plural logic blocks may be programmably coupled, in response to configuration information. Therefore, the programmable logic device 101 performs various logical operations.

Configuration information 111 is input to the programmable logic device 101 illustrated in FIG. 1A, and the operation configuration and connection of a plurality of logic blocks are performed in accordance with the configuration information 111. The operation configuration and connection of the plural logic blocks are fixed based on the configuration information 111. A plurality of input data streams 112 are sequentially input to the programmable logic device 101, the plural logic blocks perform the logical operation of the input data stream 112, and the result 113 of the logical operation is output.

First configuration information 121a is input to the programmable logic device 101 illustrated in FIG. 1B, and the operation configuration and connection of a plurality of logic blocks are performed in accordance with the first configuration information 121a. A first input data stream 122a is input to the programmable logic device 101, the logical operation of the first input data stream 122a is performed, and the result 123a of the logical operation is output. While the first input data stream 122a is input, second configuration information 121b is input to the programmable logic device 101 to be stored therein. When having finished the logical operation of the first input data stream 122a, the programmable logic device 101 performs the connection of a plurality of logic blocks in accordance with the stored second configuration information 121b. After that, a second input data stream 122b is input to the programmable logic device 101, the logical operation of the second input data stream 122b is performed, and the result 123b of the logical operation is output. While the above-mentioned second input data stream 122b is input, third configuration information 121c is input to the programmable logic device 101 to be stored therein. When having finished the logical operation of the second input data stream 122b, the programmable logic device 101 performs the connection of a plurality of logic blocks in accordance with the stored third configuration information 121c. After that, a third input data stream 122c is input to the programmable logic device 101, the logical operation of the third input data stream 122c is performed, and the result 123c of the logical operation is output. The parallel input of the configuration information and the input data stream may be repeated.

In the case of existing reconfiguration method for the programmable logic device 101, the first configuration information 121a is input to the programmable logic device 101, and the connection of the plural logic blocks is performed in accordance with the first configuration information 121a. Next, the first input data stream 122a is input to the programmable logic device 101, the logical operation of the first input data stream 122a is performed, and the result 123a of the logical operation is output. After that, after the programmable logic device 101 has halted the operation thereof once, the second configuration information 121b is input to the programmable logic device 101, and the connection of the plural logic blocks is performed in accordance with the second configuration information 121b. Next, the second input data stream 122b is input to the programmable logic device 101, the logical operation of the second input data stream 122b is performed, and the result 123b of the logical operation is output. After that, after the programmable logic device 101 has halted the operation thereof once, the third configuration information 121c is input to the programmable logic device 101, and the connection of the plural logic blocks is performed in accordance with the third configuration information 121c. Next, the third input data stream 122c is input to the programmable logic device 101, the logical operation of the third input data stream 122c is performed, and the result 123c of the logical operation is output. When the input data streams 121a to 121c and the pieces of configuration information 122a to 122c are sequentially input, a process time for outputting the logical operation results 123a to 123c may be large.

On the other hand, in the configuration variable mode illustrated in FIG. 1B, the input data streams 121a to 121c and the pieces of configuration information 122a to 122c are input to the programmable logic device 101 in parallel. Since the operation configuration and connection of the plural logic blocks based on the pieces configuration information 121a to 121c are dynamically changed at a fast rate, the logical operation results 123a to 123c may be obtained in a short time.

Figure 2:
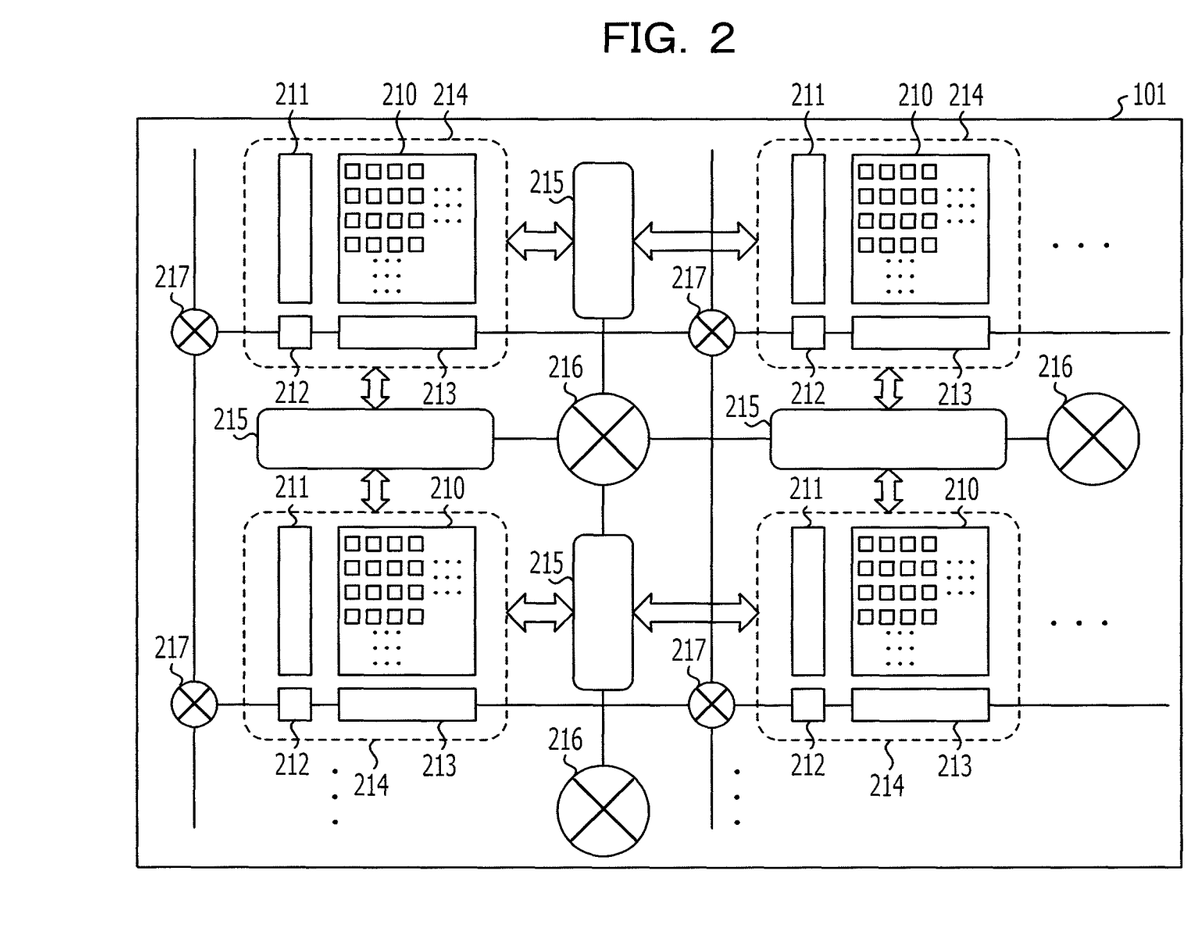
FIG. 2 illustrates an exemplary programmable logic device.
Figure 3:
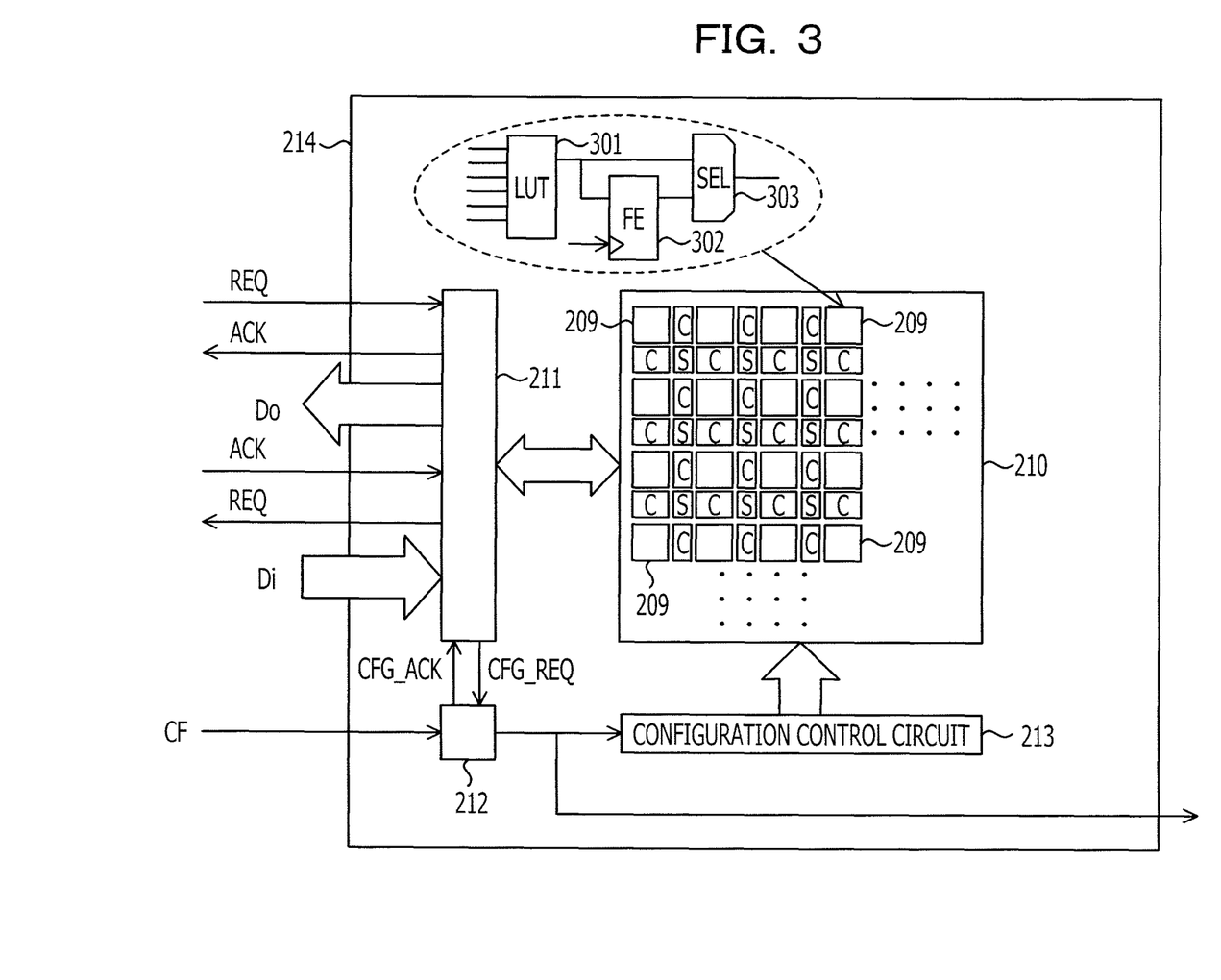
FIG. 3 illustrates an exemplary reconfiguration unit.

FIG. 2 illustrates an exemplary programmable logic device of this invention. FIG. 3 illustrates an exemplary reconfiguration unit. A reconfiguration unit 214 illustrated in FIG. 3 may be disposed within the programmable logic device 101 illustrated in FIG. 2. A plurality of reconfiguration units 214 are arrayed in the form of a two-dimensional array. Each reconfiguration unit 214 includes a logic block unit 210, a data control circuit 211, a configuration information control circuit 212, and a configuration control circuit 213. The logic block unit 210 includes a plurality of logic blocks 209, a plurality of switch boxes S, and a plurality of connection boxes C, and the plural logic blocks 209 may be programmably coupled. The plural logic blocks 209 are arrayed in the form of a two-dimensional array, include, for example, a look-up table 301, a flip-flop 302 and a selector 303, and perform a logical operation. The input-output terminals of the plural logic blocks 209 are mutually coupled by the switch box S and the connection box C. The address signal of the look-up table 301 may correspond to a logical input signal, and the output signal thereof may correspond to a logical operation result. The data of the look-up table 301 is rewritten, and hence the logic block 209 equivalent to an arbitrary logical operation is generated. The output signal of the logic block 209 may be wired through the connection box C so as to be wire-connected to another arbitrary logic block 209 by the programmably switchable switch box S. Configuration information CF is input to the configuration control circuit 213 from the configuration information control circuit 212, and the data of the look-up table 301 and the connection of the switch box S and the connection of the connection box C are controlled in accordance with the configuration information CF.

When a configuration request signal CFG_REQ is input from the data control circuit 211, the configuration information control circuit 212 outputs the configuration information CF from a configuration routine unit 217, to the configuration control circuit 213. In accordance with the configuration information CF, the configuration control circuit 213 controls the operation configuration and connection of the plural logic blocks 209 within the logic block unit 210. The configuration information control circuit 212 outputs a configuration acknowledge signal CFG_ACK to the data control circuit 211.

The data control circuit 211 outputs a data request signal REQ to a connection unit 215. On the basis of a data acknowledge signal ACK and an input data stream Di, which are supplied based on the data request signal REQ from the connection unit 215, the data control circuit 211 outputs the input data stream Di to the logic block unit 210. The plural logic blocks 209 in the logic block unit 210 perform a logical operation on the input data stream Di, and outputs the output data stream Do of a logical operation result to the data control circuit 211. In response to the data request signal REQ from the connection unit 215, the data control circuit 211 outputs the data acknowledge signal ACK and the output data stream Do to the connection unit 215.

The data control circuit 211 outputs the configuration request signal CFG_REQ, and loads the configuration information CF into the logic block unit 210. The data control circuit 211 receives the configuration acknowledge signal CFG_ACK indicating the completion of configuration. Next, the data control circuit 211 transmits the data request signal REQ to the connection unit 215. The data control circuit 211 receives the input data stream Di and the data acknowledge signal ACK from the connection unit 215. Next, the data control circuit 211 receives the data request signal REQ from another logic block unit 210. After the logical operation of the logic block unit 210 has been completed, the data control circuit 211 transmits the output data stream Do and the data acknowledge signal ACK. The above-mentioned process may be repeated.

The configuration routine unit 217 is coupled to the network wiring line of the configuration information CF, and controls the output of the configuration information CF to the plural reconfiguration units 214. The data routine unit 216 is coupled between the plural reconfiguration units 214, and controls the input and output of the pieces of data Di and Do, the data request signals REQ, and the data acknowledge signals ACK of the plural reconfiguration units 214. The connection unit 215 is coupled between the plural reconfiguration units 214, and controls the input and output of the pieces of data Di and Do, the data request signals REQ, and the data acknowledge signals ACK of the plural reconfiguration units 214.

Between the individual reconfiguration units 214, asynchronous communication based on the data request signal REQ and the data acknowledge signal ACK is performed, and the independence of each reconfiguration unit 214 is secured. Between the reconfiguration units 214, the connection unit 215 and the data routine unit 216 may be provided, and communication between the individual reconfiguration units 214 may be performed asynchronously and programmably. The data routine unit 216 and the configuration routine unit 217 are provided for the data streams Di and Do and the data flow of the configuration information CF, respectively. Therefore, the data streams Di and Do and the configuration information CF may flow through different routes.

The reconfiguration unit 214 is coupled through the connection unit 215. The connection unit 215 is coupled to the data-flow routine unit 216. The configuration information CF of each reconfiguration unit 214 is supplied through the configuration routine unit 217.

The number of the logic blocks 209 included in the logic block unit 210 may be arbitrary, and, for example, may be several hundreds. The logic block units 210 of substantially the same size may be provided, and the logic block units 210 of a plurality of sizes may be provided. The size of the logic block unit 210 may be variable.

Figure 4:
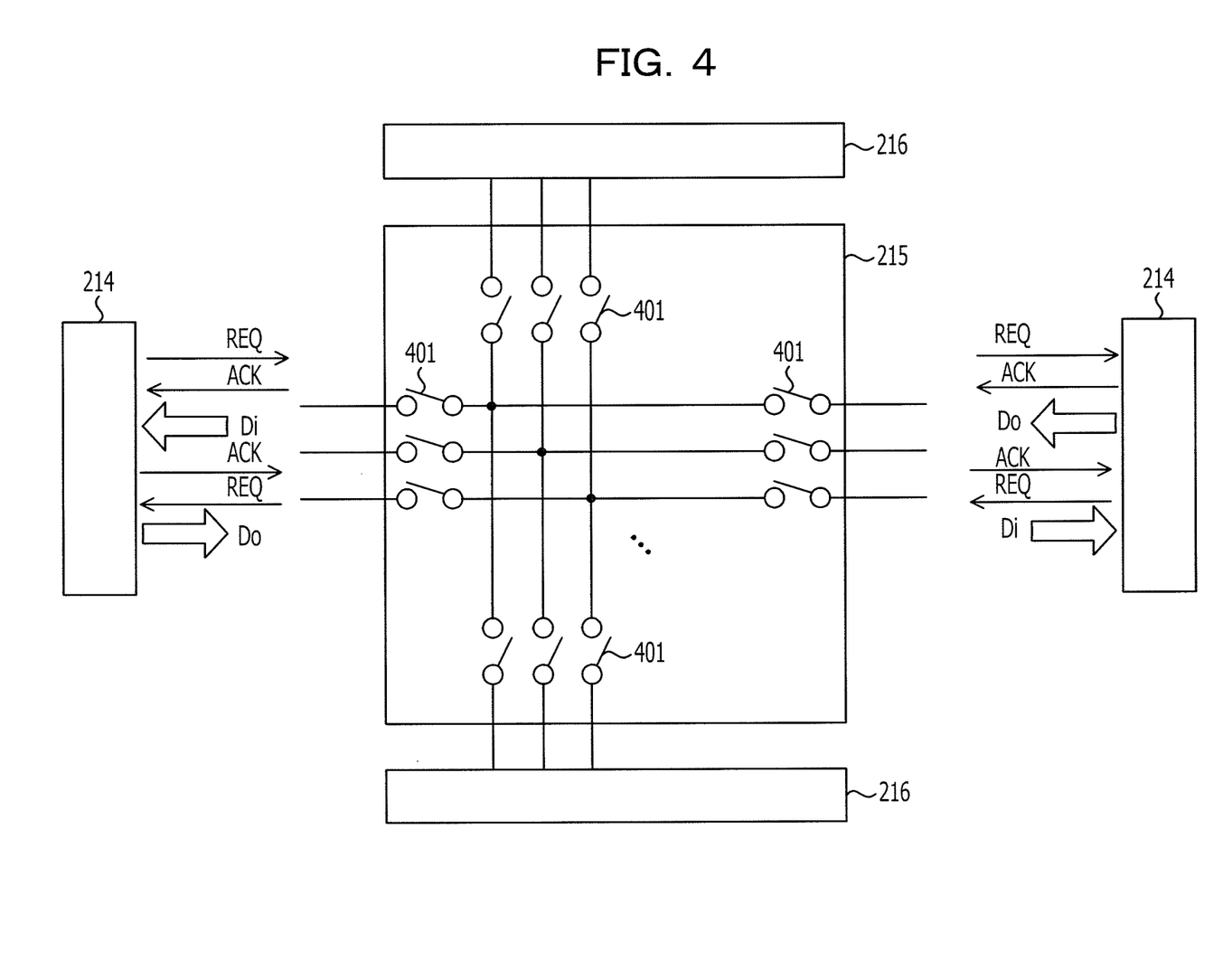
FIG. 4 illustrates an exemplary connection unit.

FIG. 4 illustrates an exemplary connection unit. A connection unit illustrated in FIG. 4 may be the connection unit 215 illustrated in FIG. 2. The connection unit 215 is coupled to the reconfiguration unit 214 and the data routine unit 216. In the connection unit 215, the pieces of data Di and Do, the data request signal REQ, and the data acknowledge signal ACK from the reconfiguration unit 214 are combined by a cruciform switch composite circuit 401. The switch composite circuit 401 includes an array corresponding to the bus width of the pieces of data Di and Do and the array of the data request signal REQ and the data acknowledge signal ACK. In the switch composite circuit 401, the bus width may also be decreased based on the requirement specification of the programmable logic device 101. The setting of the switch composite circuit 401 may also be preliminarily performed, and may also be controlled by the configuration control circuit 213 in the adjacent reconfiguration unit 214.

Figure 5:
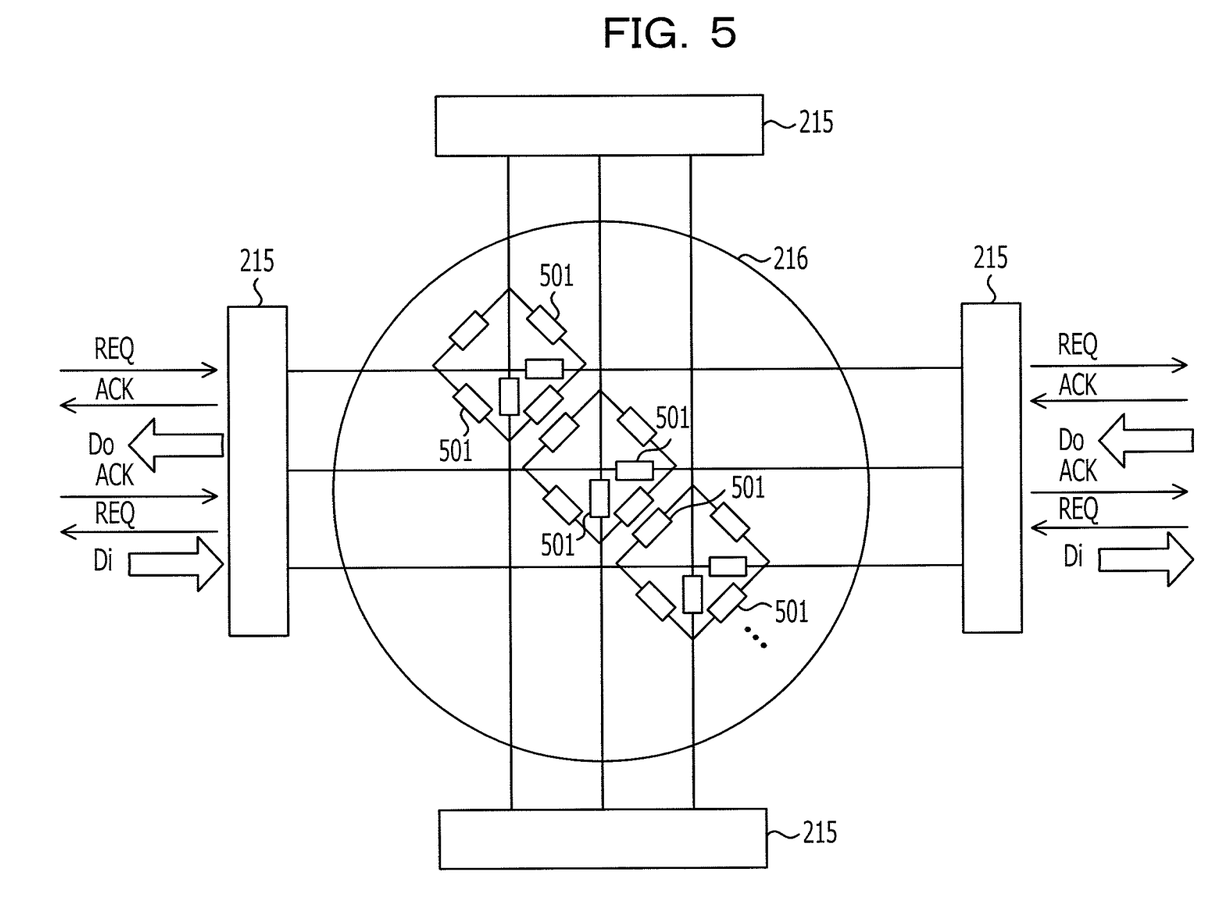
FIG. 5 illustrates an exemplary data routine unit.

FIG. 5 illustrates an exemplary data routine unit. The data routine unit illustrated in FIG. 5 may be the data routine unit 216 illustrated in FIG. 2. In the data routine unit 216, the pieces of data Di and Do, the data request signals REQ, and the data acknowledge signals ACK from the up, down, right, and left connection units 215 are combined by a switch composite circuit including six switches 501. The switch composite circuit includes an array corresponding to the bus width of the pieces of data Di and Do and the array of the data request signal REQ and the data acknowledge signal ACK. In the switch composite circuit a switch, which is used for alternating a line within a bus, may also be added based on the requirement specification of the programmable logic device 101 and the capacity of a circuit resource. Signal lines in all buses may also be set so as to be capable of be connected, and a signal line may also be set so as to be capable of be connected in response to a requirement specification. The setting of each switch 501 may also be preliminarily performed, and may also be controlled by the configuration control circuit 213 in the adjacent reconfiguration unit 214 through the connection unit 215. The data routine unit 216 may also be the circuit illustrated in FIG. 4, and the connection unit 215 may also be the circuit illustrated in FIG. 5.

Figure 6:
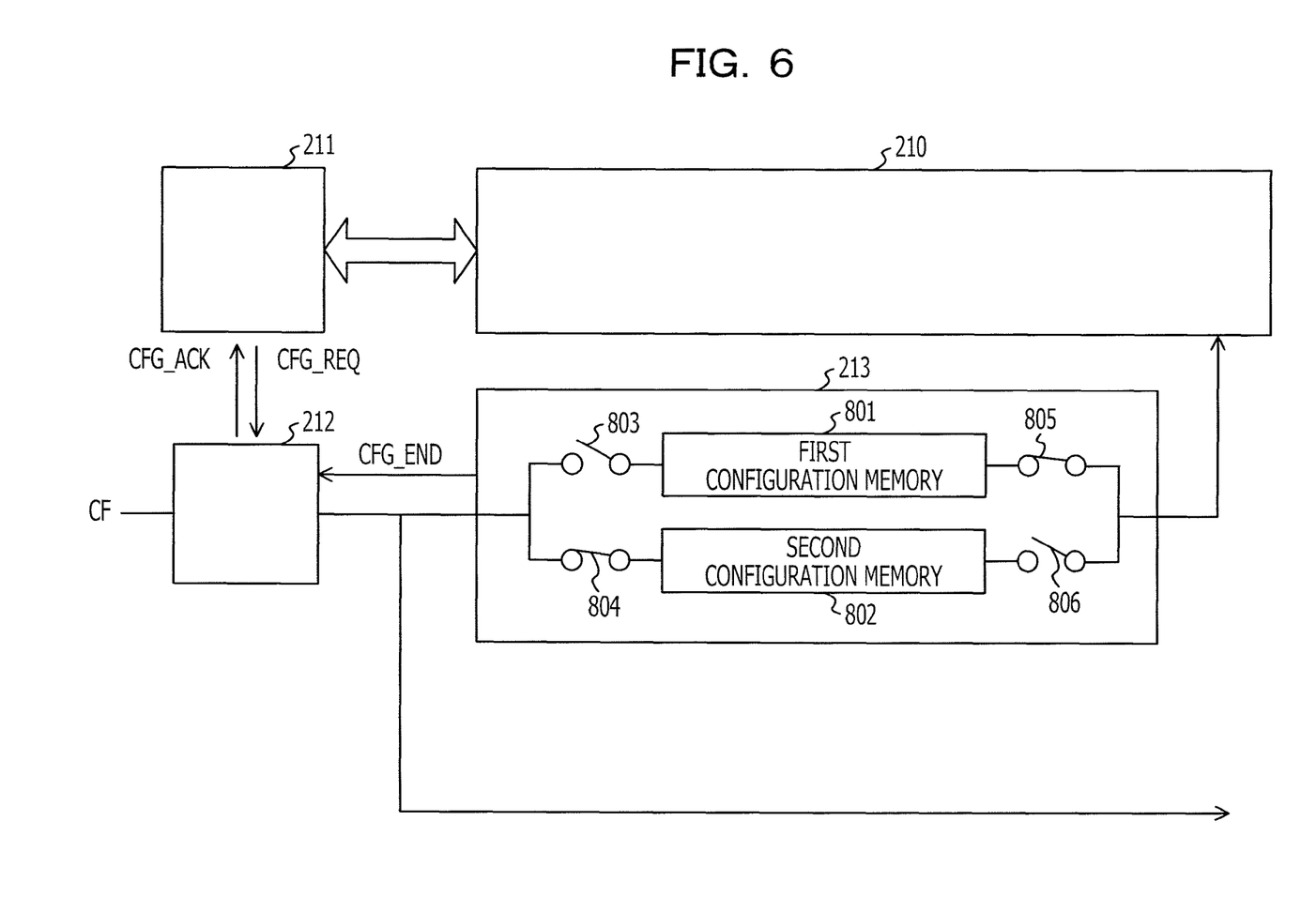
FIG. 6 illustrates an exemplary configuration control circuit.

FIG. 6 illustrates an exemplary configuration control circuit. The configuration control circuit illustrated in FIG. 6 may be the configuration control circuit 213 illustrated in FIG. 2. The configuration control circuit 213 includes a first configuration memory 801, for example, a memory bank, a second configuration memory 802, for example, a memory bank, and switches 803 to 806.

By turning on the switch 803, the configuration information CF from the configuration information control circuit 212 is written into the first configuration memory 801. By turning on the switch 804, the configuration information CF from the configuration information control circuit 212 is written into the second configuration memory 802. By turning on the switch 805, the configuration information CF read from the first configuration memory 801 or control information corresponding to the configuration information CF is output to the logic block unit 210. By turning on the switch 806, the configuration information CF read from the second configuration memory 802 or control information corresponding to the configuration information CF is output to the logic block unit 210.

Figure 7:
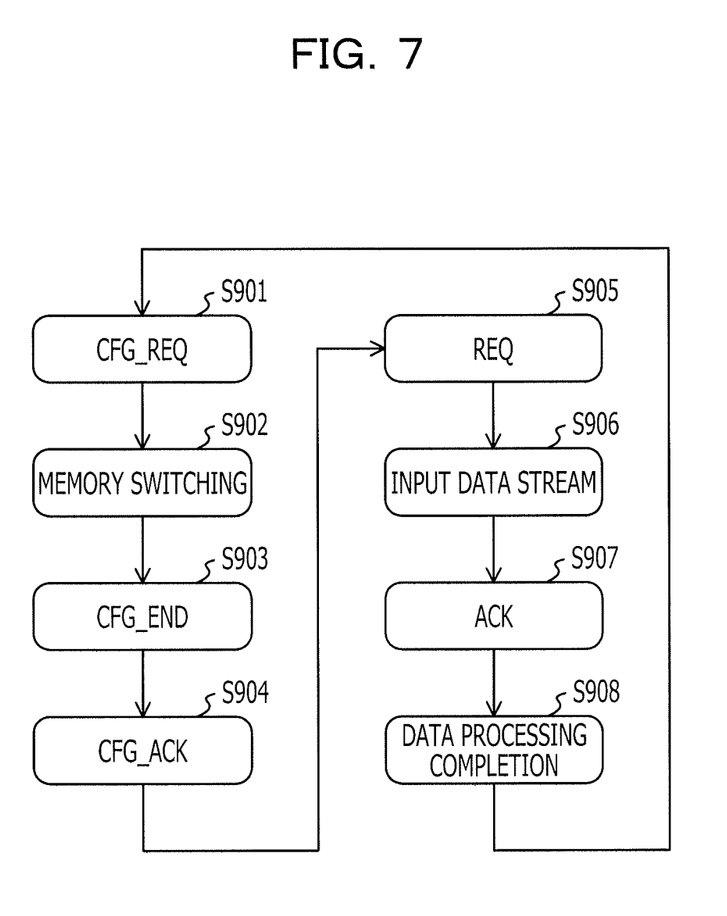
FIG. 7 illustrates an exemplary process of a programmable logic device.

FIG. 7 illustrates an exemplary process of a programmable logic device. The process illustrated in FIG. 7 may be executed by the programmable logic device illustrated in FIG. 2. In an operation S901, the data control circuit 211 outputs the configuration request signal CFG_REQ.

In an operation S902, the configuration control circuit 213 turns on the switch 803 and turns off the switch 804, for the sake of switching a memory, and writes the configuration information CF into the first configuration memory 801. The configuration control circuit 213 turns off the switches 803 and 806, turns on the switch 805, and outputs the configuration information CF within the first configuration memory 801, to the logic block unit 210.

In an operation S903, the configuration control circuit 213 outputs a configuration termination signal CFG_END to the configuration information control circuit 212.

In an operation S904, the configuration information control circuit 212 outputs the configuration acknowledge signal CFG_ACK to the data control circuit 211.

In an operation S905, the data control circuit 211 outputs the data request signal REQ.

In operations S906 and S907, the data control circuit 211 inputs the input data stream Di and the data acknowledge signal ACK, and outputs the input data stream Di to the logic block unit 210.

In a operation S908, the data process is terminated. The process returns to the operation S901 and the same process may be repeated.

Figure 8A:
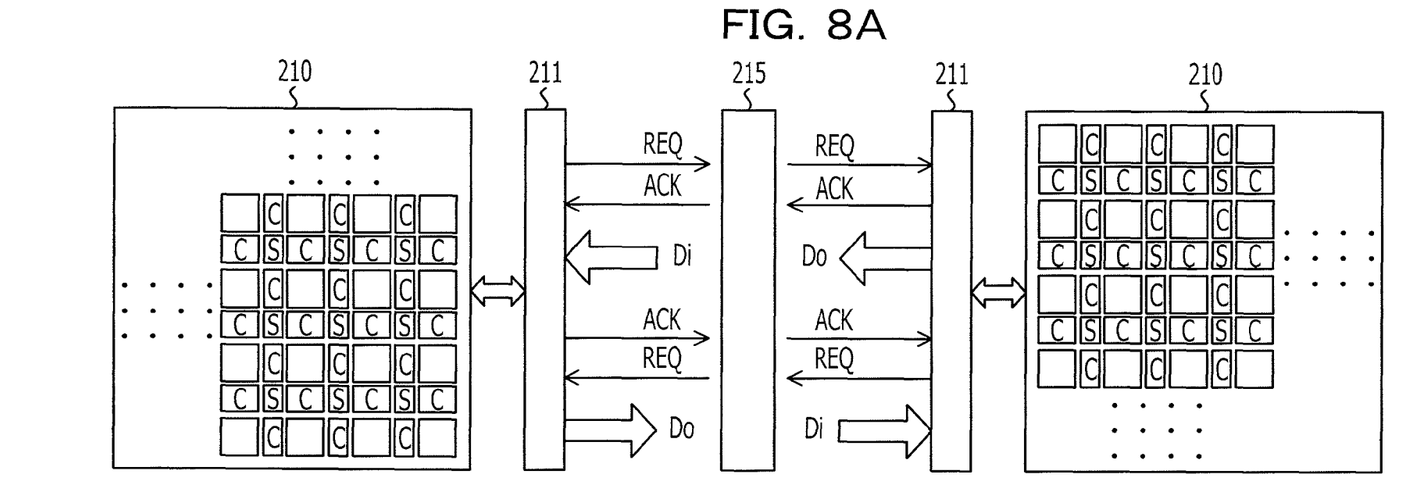
FIG. 8A illustrates an exemplary programmable logic device.

FIG. 8A illustrates an exemplary programmable logic device. For example, FIG. 8A may illustrate a partial circuit of the programmable logic device 101 illustrated in FIG. 2. The data control circuit 211 within the reconfiguration unit 214 inputs and outputs, to and from the data control circuit 211 within another reconfiguration unit 214, the pieces of data Di and Do, the data request signal REQ, and the data acknowledge signal ACK through the connection unit 215.

Figure 8B:
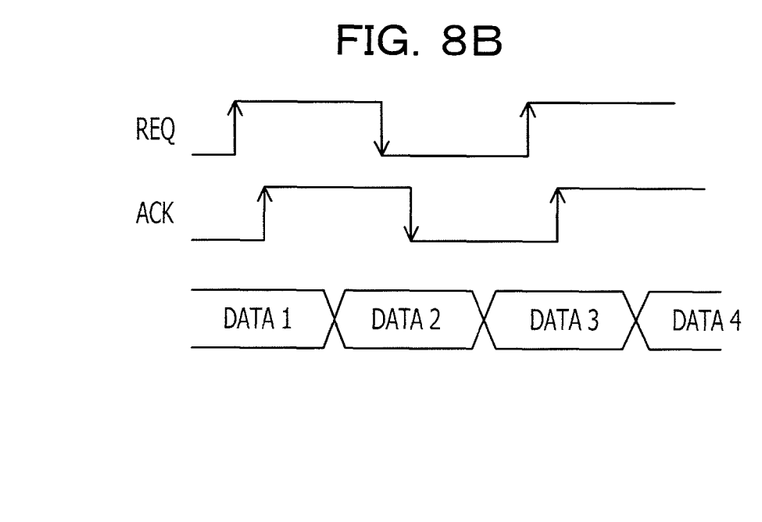
FIG. 8B illustrates an exemplary two-phase asynchronous communication.

FIG. 8B illustrates an exemplary two-phase asynchronous communication. FIG. 8B may illustrate the timing chart of a double edge method where the input and output of the pieces of data Di and Do are performed in synchronization with the rising edges and the falling edges of the data request signal REQ and the data acknowledge signal ACK. Based on the input of the rising edge or falling edge of the data request signal REQ, the data control circuit 211 within one reconfiguration unit 214 outputs the data acknowledge signal ACK corresponding to the rising edge or the falling edge, along with the output data stream Do. In response to the output of the rising edge or falling edge of the data request signal REQ, the data control circuit 211 within another reconfiguration unit 214 receives the data acknowledge signal ACK corresponding to the rising edge or the falling edge, along with the input data stream Di.

Figure 8C:
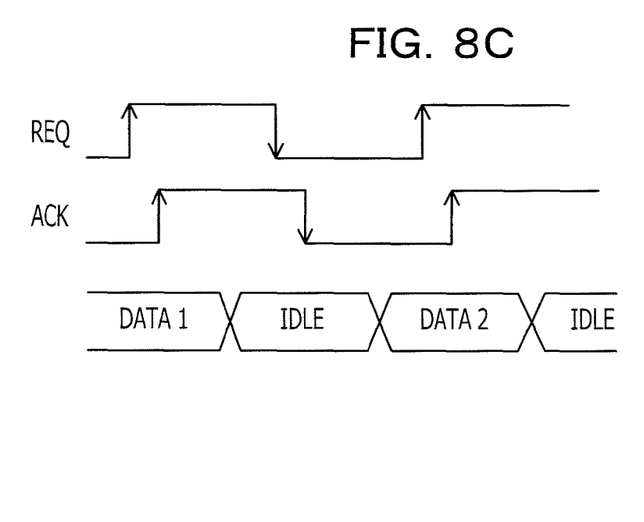
FIG. 8C illustrates an exemplary four-phase asynchronous communication.

FIG. 8C illustrates an exemplary four-phase asynchronous communication. FIG. 8C may illustrate the timing chart of a single edge method where the input and output of the pieces of data Di and Do are performed in synchronization with the rising edges of the data request signal REQ and the data acknowledge signal ACK. Based on the input of the rising edge of the data request signal REQ, the data control circuit 211 within one reconfiguration unit 214 outputs the data acknowledge signal ACK corresponding to the rising edge, along with the output data stream Do. In response to the output of the rising edge of the data request signal REQ, the data control circuit 211 within another reconfiguration unit 214 receives the data acknowledge signal ACK corresponding to the rising edge, along with the input data stream Di.

In FIGS. 8A to 8C, while signals between the connection unit 215 and the data control circuit 211 are illustrated, signals between the data control circuit 211 and the configuration information control circuit 212, signals between the plural configuration routine units 217, signals between the connection unit 215 and the data routine unit 216 may also be substantially the same. The timing form of one of the two-phase type in FIG. 8B and the four-phase type in FIG. 8C may be used.

Figure 9A:
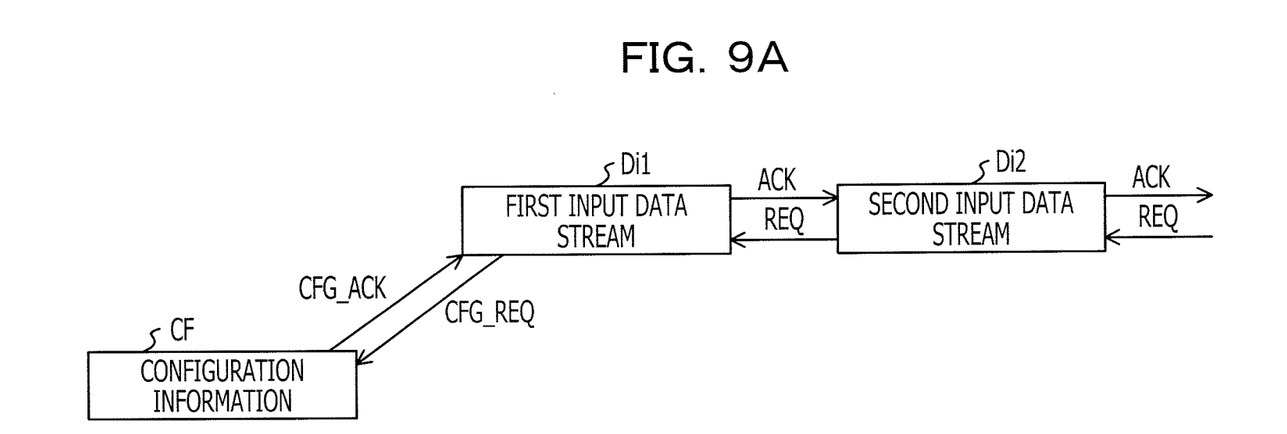
FIGS. 9A and 9B illustrate an exemplary input of a programmable logic device.
Figure 9B:
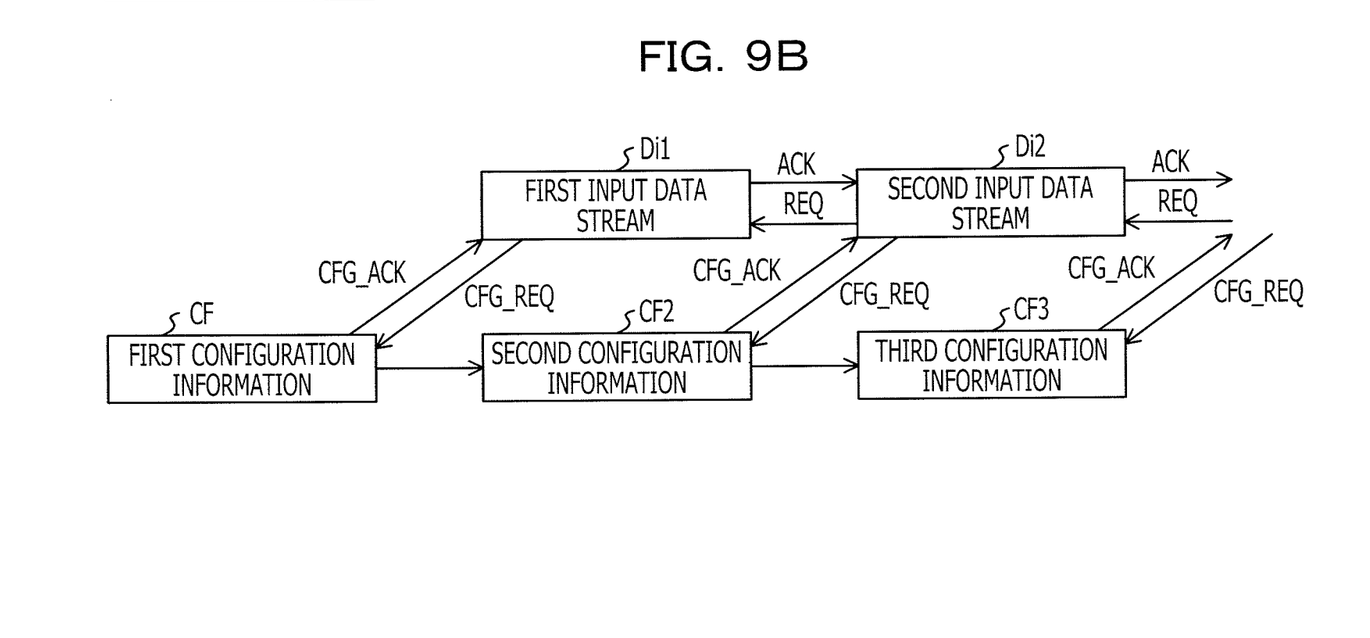

FIGS. 9A and 9B illustrate an exemplary an input of a programmable logic device. For example, the programmable logic device 101 illustrated in FIG. 9A is set to the configuration fixed mode. When having received the configuration request signal CFG_REQ from the data control circuit 211, the configuration information control circuit 212 inputs thereinto and outputs the configuration information CF to the configuration control circuit 213. The configuration control circuit 213 receives the configuration information CF, turns on the switch 803, and writes the configuration information CF into the first configuration memory 801. The configuration control circuit 213 turns off the switches 803 and 806, turns on the switch 805, outputs the configuration information CF stored in the first configuration memory 801 to the logic block unit 210, and controls the operation configuration and connection of the plural logic blocks 209 within the logic block unit 210 in response to the configuration information CF. The operation configuration and connection state of the plural logic blocks 209 are set in response to the configuration information CF.

The configuration control circuit 213 outputs the configuration termination signal CFG_END to the configuration information control circuit 212. The configuration information control circuit 212 outputs the configuration acknowledge signal CFG_ACK to the data control circuit 211.

The data control circuit 211 receives the data acknowledge signal ACK and a first input data stream Di1 in response to the output of the data request signal REQ, and outputs the first input data stream Di1 to the logic block unit 210. The logic block unit 210 outputs the logical operation result of the first input data stream Di1.

The data control circuit 211 receives the data acknowledge signal ACK and a second input data stream Di2 in response to the output of the data request signal REQ, and outputs the second input data stream Di2 to the logic block unit 210. The logic block unit 210 outputs the logical operation result of the second input data stream Di2. In the same way, the data control circuit 211 sequentially outputs an input data stream to the logic block unit 210.

In the configuration fixed mode, the partial reconfiguration is not performed. An application may not frequently perform the reconfiguration of the logic block unit 210. The programmable logic device is set to the configuration fixed mode by the mode switching. The configuration information CF is set to a hold state based on a control signal. In this kind of case, subsequent input data streams Di1 and Di2 and the like sequentially flow, and performance by using the configuration fixed mode may be improved.

FIG. 9B illustrates an exemplary input of a programmable logic device. For example, the programmable logic device 101 illustrated in FIG. 9B is set to the configuration variable mode. When having received the configuration request signal CFG_REQ from the data control circuit 211, the configuration information control circuit 212 outputs first configuration information CF1 to the configuration control circuit 213. The configuration control circuit 213 receives the first configuration information CF1, turns on the switch 803, and writes the first configuration information CF1 into the first configuration memory 801. The configuration control circuit 213 turns off the switches 803 and 806, turns on the switch 805, outputs the first configuration information CF1 stored in the first configuration memory 801 to the logic block unit 210. The operation configuration and connection of the plural logic blocks 209 within the logic block unit 210 are controlled in response to the first configuration information CF1.

The configuration control circuit 213 outputs the configuration termination signal CFG_END to the configuration information control circuit 212. The configuration information control circuit 212 outputs the configuration acknowledge signal CFG_ACK to the data control circuit 211.

The data control circuit 211 receives the data acknowledge signal ACK and the first input data stream Di1 in response to the output of the data request signal REQ, and outputs the first input data stream Di1 to the logic block unit 210. The logic block unit 210 outputs the logical operation result of the first input data stream Di1.

While the data control circuit 211 outputs the first input data stream Di1 to the logic block unit 210, the configuration information control circuit 212 receives the configuration request signal CFG_REQ from the data control circuit 211, and outputs second configuration information CF2 to the configuration control circuit 213. The configuration control circuit 213 receives the second configuration information CF2, turns off the switches 803 and 806, turns on the switches 804 and 805, and writes the second configuration information CF2 into the second configuration memory 802. The data control circuit 211 completes outputting the first input data stream Di1 to the logic block unit 210. When the logical operation of the first input data stream Di1 has been terminated, the logic block unit 210 outputs a logical operation termination signal to the data control circuit 211. The data control circuit 211 and the configuration control circuit 213 turn on the switches 803 and 806, turn off the switches 804 and 805, and output the second configuration information CF2 stored in the second configuration memory 802 to the logic block unit 210. The operation configuration and connection of the plural logic blocks 209 within the logic block unit 210 are controlled in response to the second configuration information CF2.

The configuration control circuit 213 outputs the configuration termination signal CFG_END to the configuration information control circuit 212. The configuration information control circuit 212 outputs the configuration acknowledge signal CFG_ACK to the data control circuit 211.

The data control circuit 211 inputs the data acknowledge signal ACK and the second input data stream Di2 in response to the output of the data request signal REQ, and outputs the second input data stream Di2 to the logic block unit 210. The logic block unit 210 outputs the logical operation result of the second input data stream Di2.

While the data control circuit 211 outputs the second input data stream Di2 to the logic block unit 210, the configuration information control circuit 212 receives the configuration request signal CFG_REQ from the data control circuit 211, and outputs third configuration information CF3 to the configuration control circuit 213. The configuration control circuit 213 receives the third configuration information CF3, turns off the switches 804 and 805, turns on the switches 803 and 806, and writes the third configuration information CF3 into the first configuration memory 801. The data control circuit 211 completes outputting the second input data stream Di2 to the logic block unit 210. When the logical operation of the second input data stream Di2 has been terminated, the logic block unit 210 outputs the logical operation termination signal to the data control circuit 211. The data control circuit 211 and the configuration control circuit 213 turn on the switches 804 and 805, turn off the switches 803 and 806, and output the third configuration information CF3 stored in the first configuration memory 801 to the logic block unit 210. The operation configuration and connection of the plural logic blocks 209 within the logic block unit 210 are controlled in response to the third configuration information CF3.

The same process may be repeated. The pieces of configuration information CF1 to CF3 and the like are alternately stored in the first configuration memory 801 and the second configuration memory 802 in that order.

In the configuration variable mode, the second configuration information CF2 is input during the process of the previous first input data stream Di1. For example, while the data control circuit 211 outputs the first input data stream Di1 to the logic block unit 210, the configuration control circuit 213 receives and stores the second configuration information CF2. Therefore, the operation configuration and connection of the plural logic blocks 209 based on the second configuration information CF2 may be dynamically performed at a fast rate, and a logical operation result may be obtained at a fast rate.

Since the reconfiguration of the logic block unit 210 may be automatically performed at a rate that is substantially the same as or similar to the transfer rate of the input data stream Di, following improvements may be performed.

1) A fast configuration change may be performed. 2) During the input of the input data stream Di, a dynamic configuration change may be performed based on the configuration information CF. 3) A configuration change is performed by a control circuit within the reconfiguration unit 214. 4) Since the input data stream Di and the configuration information CF flow, the halt of a data flow may be reduced. 5) Since each reconfiguration unit 214 is self-contained, the size of the reconfiguration unit 214 may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A programmable logic device comprising:
a logic block unit including a plurality of logic blocks which are programmably connectable and perform a logical operation on an input data stream; and
a configuration control circuit configured to control a logical operation configuration of the plurality of logic blocks in response to configuration information, wherein the configuration control circuit controls the logical operation configuration of the plurality of logic blocks based on first configuration information for a logical operation of a first input data stream included in the input data stream, receives second configuration information for a logical operation of a second input data stream included in the input data stream, while the first input data stream is supplied to the logic block unit, and controls a logical operation configuration of the second data stream based on the second configuration information in response to termination of the logical operation of the first input data stream.

2. The programmable logic device according to claim 1, further comprising, a data control circuit configured to output the first input data stream and the second input data stream to the logic block unit.

3. The programmable logic device according to claim 1, wherein the configuration control circuit includes a first configuration memory to store the first configuration information and a second configuration memory to store the second configuration information.

4. The programmable logic device according to claim 3, wherein the configuration control circuit writes the first configuration information in the first configuration memory, and writes the second configuration information in the second configuration memory while the first input data stream is supplied to the logic block unit.

5. The programmable logic device according to claim 3, wherein the configuration control circuit controls the logical operation configuration of the plurality of logic blocks based on the second configuration information stored in the second configuration memory, in response to the termination of the logical operation of the first input data stream by the logic block unit.

6. The programmable logic device according to claim 1, further comprising, a configuration information control circuit configured to output configuration information to the configuration control circuit based on a configuration request signal.

7. The programmable logic device according to claim 6, further comprising, a data control circuit configured to output the first input data stream and the second input data stream to the logic block unit and supply the configuration request signal to the configuration information control circuit, wherein the configuration information control circuit outputs a configuration acknowledge signal to the data control circuit in response to the configuration request signal.

8. The programmable logic device according to claim 1, further comprising, a data control circuit configured to output the first input data stream or the second input data stream to the logic block unit based on a data acknowledge signal supplied in response to a data request signal.

9. The programmable logic device according to claim 1, wherein the configuration control circuit receives, in a first mode, the second configuration information while the first input data stream is supplied to the logic block unit, and controls, in a second mode, logical operation configurations of the first input data stream and the second input data stream sequentially input after input of the configuration information.

10. A programmable logic device comprising:

a plurality of reconfiguration units configured including a logic block unit and a configuration control circuit, wherein the logic block unit including a plurality of logic blocks which are programmably connectable and perform a logical operation on an input data stream; and the configuration control circuit configured to control a logical operation configuration of the plurality of logic blocks in response to configuration information, wherein the configuration control circuit controls the logical operation configuration of the plurality of logic blocks based on first configuration information for a logical operation of a first input data stream included in the input data stream, receives second configuration information for a logical operation of a second input data stream included in the input data stream, while the first input data stream is supplied to the logic block unit, and controls a logical operation configuration of the second data stream based on the second configuration information in response to termination of the logical operation of the first input data stream.

11. The programmable logic device according to claim 10, wherein each of the plurality of reconfiguration units includes a data control circuit configured to output the first input data stream and the second input data stream to the logic block unit.

12. The programmable logic device according to claim 10, further comprising:

a data routine unit, coupled between the plural reconfiguration units, configured to control input and output of data of the plurality of reconfiguration units; and a configuration routine unit configured to control output of configuration information to the plurality of reconfiguration units.

13. The programmable logic device according to claim 10, wherein the configuration control circuit receives, in a first mode, the second configuration information while the first input data stream is supplied to the logic block unit, and controls, in a second mode, logical operation configurations of the first input data stream and the second input data stream sequentially input after input of the configuration information.

* * * * *